(12) United States Patent
Joo

(10) Patent No.: US 8,389,994 B2
(45) Date of Patent: Mar. 5, 2013

(54) POLYSILICON THIN FILM TRANSISTOR HAVING TRENCH TYPE COPPER BOTTOM GATE STRUCTURE AND METHOD OF MAKING THE SAME

(76) Inventor: Seung Ki Joo, Seongnam-si (KR)

( * ) Notice: Subject to any disclaimer, the term of this patent is extended or adjusted under 35 U.S.C. 154(b) by 45 days.

(21) Appl. No.: 13/182,625

(22) Filed: Jul. 14, 2011

(65) Prior Publication Data

US 2012/0161144 A1 Jun. 28, 2012

(30) Foreign Application Priority Data

Dec. 23, 2010 (KR) .................. 10-2010-0133127

(51) Int. Cl.
*H01L 29/10* (2006.01)
*H01L 31/036* (2006.01)
*H01L 21/00* (2006.01)

(52) U.S. Cl. ........... 257/66; 257/E29.291; 257/E21.414; 438/158

(58) Field of Classification Search ............ 257/66, 257/E21.414, E29.291; 438/158, 687
See application file for complete search history.

(56) References Cited

U.S. PATENT DOCUMENTS

| 6,426,263 B1 * | 7/2002 | Chittipeddi | 438/281 |
| 6,586,768 B1 * | 7/2003 | Huang et al. | 257/59 |
| 7,351,617 B2 * | 4/2008 | Yamazaki et al. | 438/149 |
| 7,829,393 B2 * | 11/2010 | Liu et al. | 438/144 |
| 7,902,533 B2 * | 3/2011 | Osame et al. | 250/552 |
| 2004/0142516 A1 * | 7/2004 | Lee et al. | 438/149 |
| 2006/0110866 A1 * | 5/2006 | Gan et al. | 438/151 |

FOREIGN PATENT DOCUMENTS

| KR | 10-2006-0115522 | 11/2006 |
| KR | 10-2009-0042122 | 4/2009 |

* cited by examiner

*Primary Examiner* — William D Coleman
(74) *Attorney, Agent, or Firm* — Cantor Colburn LLP

(57) ABSTRACT

Provided is a polysilicon thin film transistor having a trench type bottom gate structure using copper and a method of making the same. The polysilicon thin film transistor includes: a transparent insulation substrate; a seed pattern that is formed in a pattern corresponding to that of a gate electrode on the transparent insulation substrate, and that is used to form the gate electrode; a trench type guide portion having a trench type contact window in which an upper portion of the seed pattern is exposed; the gate electrode that is formed by electrodepositing copper on a trench of the exposed seed pattern; a gate insulation film formed on the upper portions of the gate electrode and the trench type guide portion, respectively; and a polysilicon layer in which a channel region, a source region and a drain region are formed on the upper portion of the gate insulation film.

11 Claims, 8 Drawing Sheets back exposure back exposure

POLYSILICON THIN FILM TRANSISTOR HAVING TRENCH TYPE COPPER BOTTOM GATE STRUCTURE AND METHOD OF MAKING THE SAME

CROSS-REFERENCE TO RELATED APPLICATION

This application claims the benefit of Korean Patent Application No. 10-2010-0133127, filed on Dec. 23, 2010, in the Korean Intellectual Property Office, the disclosure of which is incorporated herein by reference.

BACKGROUND OF THE INVENTION

1. Field of the Invention

The present invention relates to a polysilicon thin film transistor having a bottom gate structure using copper and a method of making the same. More particularly, the present invention relates to a polysilicon thin film transistor having a trench type copper bottom gate structure and a method of making the same, in which copper with a low resistance value is used as a bottom gate by an electroplating method without using a copper patterning process so as to be appropriate for a large display, and a step coverage is solved by making a copper gate buried into and planarized in a trench structure.

2. Description of the Related Art

In general, various kinds of metal and metal alloys such as aluminum (Al), molybdenum (Mo), and molybdenum-tungsten (MoW) are used as a gate electrode constituting a bottom gate of a thin film transistor (hereinafter referred to TFT). The reason why the aluminum (Al), molybdenum (Mo), molybdenum-tungsten (MoW), etc., are used as a material of the gate electrode is because for example aluminum oxide (Al2O3) can be used as a gate insulation film to thereby make it easy to make the gate insulation film.

However, in the case that aluminum is used as a gate electrode material to implement a large display, in recent years, a resistance value of a gate line (GL) that is mutually connected with a gate electrode and is simultaneously formed with the gate electrode and that is simultaneously formed together with the gate electrode in general, or a data line (DL) that is orthogonally formed with respect to the gate line (GL) and is connected to a source region, is greatly increased in proportion to the dimension of a display, As a result, a gate signal and a data signal have been delayed and distorted.

Conventional gate electrode materials are metal materials including copper (Cu) whose resistance is smaller than that of aluminum (Al). However, an appropriate etching solution that is used for etching a copper film in order to form the gate electrode and gate line has not been developed. Further, there is a problem that an etching process for etching the copper film produces heavy metals causing an environmental pollution.

In addition, in the case that copper is used as the gate electrode in a large display, respective copper wires of one micrometer or more thick are required in order to make resistance of the copper wires sufficiently small. However, it takes long time of three hours or more to form a copper film of such a thickness using a typical deposition method. Further, in the case that a gate electrode structure of a thick film is employed, a gate insulation film that is directly formed on the upper portion of a gate electrode by a well-known process may cause a step coverage problem.

Meanwhile, a conventional technology of manufacturing an array substrate using copper as a gate electrode is disclosed in Korean Patent Laid-open Publication No. 10-2006-115522.

In the Korean Patent Laid-open Publication No. 10-2006-115522, signal wires and a thin film transistor are manufactured using an electroless plating method or an electroplating method whose deposition temperature is low, considering manufacturing temperature and stress act as big constraints in the case that the array substrate using copper as a gate electrode, in comparison with a case that a glass substrates is used at the time of production of signal wires such as gate lines and data lines and a thin film transistor in order to implement a flexible display device, to thereby prevent a flexible substrate from being bent or signal line layers from being cracked, and simultaneously to thereby promote a quality of display to be improved.

To this end, the Korean Patent Laid-open Publication No. 10-2006-115522 discloses that a first electrode layer made of nickel or molybdenum, a second electrode layer made of copper, and first and second line layers for use in gate lines and data lines are formed by the electroless plating method, to thereby form an electroplating seed layer, and then source and drain regions, and a third electrode layer and a third line layer for use in gate lines and data lines are formed by the electroplating method using the electroplating seed layer.

However, the method of forming the copper gate electrode and wires of the Korean Patent Laid-open Publication No. 10-2006-115522 includes a process of patterning first and second metal layers so as to form the copper gate electrode and wires using the electroplating method, after having formed the first electrode layer for enhanced adhesion and the second electrode layer made of copper on the entire surface of the substrate by the electroless plating. As a result, the Korean Patent Laid-open Publication No. 10-2006-115522 has the same problem as that of the conventional art at the time of etching the copper metal layer.

In addition, the technology disclosed in the Korean Patent Laid-open Publication No. 10-2006-115522 may cause a step coverage problem in a subsequent process of forming the gate electrode as a thick film of one micrometer or more thick, and does not present any related solutions.

Moreover, when source and drain regions are formed in alignment with a gate electrode in the conventional art, a mask for shielding ion implantation is formed on the upper portion of the gate electrode by using a separate exposure mask and then an ion implantation process is executed. Accordingly, an alignment error of 2 to 4 micrometers may be caused. Further, such an alignment error cannot be equally distributed to both ends of a channel region and leans toward one end of the channel region, to thereby become a factor of aggravating an electrical performance of the thin film transistor (TFT).

SUMMARY OF THE INVENTION

To solve the above conventional problems or defects, it is an object of the present invention to provide a polysilicon thin film transistor having a trench type bottom gate structure using copper and a method of making the same, in which copper having a low resistance value is quickly formed as the bottom gate by an electroplating method without using a copper patterning process so as to prevent signals from being delayed and distorted in a large display.

In addition, it is another object of the present invention to provide a polysilicon thin film transistor having a trench type bottom gate structure using copper and a method of making the same, in which a copper gate is selectively formed in an insulation layer having a trench structure, to thereby eliminate a step coverage problem at the time of forming a gate insulation film, without passing through a separate planarization process.

Furthermore, it is still another object of the present invention to provide a polysilicon thin film transistor having a trench type bottom gate structure using copper and a method of making the same, in which copper is formed as a gate electrode and simultaneously an amorphous silicon film is crystallized to form a transparent polysilicon layer, to thereby make it possible to perform a strict control of a channel region by back exposure without using a separate exposure mask and automatically align a source region and a drain region with respect to a gate.

To accomplish the above and other objects of the present invention, according to an aspect of the present invention, there is provided a polysilicon thin film transistor having a trench type copper bottom gate structure, the polysilicon thin film transistor comprising:

a transparent insulation substrate;

a seed pattern that is formed in a pattern corresponding to that of a gate electrode on the transparent insulation substrate, and that is used to form the gate electrode;

a trench type guide portion having a trench type contact window in which an upper portion of the seed pattern is exposed;

the gate electrode that is formed by electrodepositing copper on a trench of the exposed seed pattern;

a gate insulation film formed on the upper portions of the gate electrode and the trench type guide portion, respectively; and a polysilicon layer in which a channel region, a source region and a drain region are formed on the upper portion of the gate insulation film.

Preferably but not necessarily, the source region and the drain region are automatically aligned with respect to the gate electrode by back exposure using the gate electrode and are disposed in the left and right sides of the channel region.

Preferably but not necessarily, the trench type guide portion is formed into a silicon oxide or nitride film.

Preferably but not necessarily, the gate electrode is connected with the gate lines made of copper.

Preferably but not necessarily, the gate electrode is at least one micrometer thick.

According to another aspect of the present invention, there is provided a method of making a polysilicon thin film transistor having a trench type copper bottom gate structure, the method comprising the steps of:

forming a seed pattern on an upper portion of an insulation substrate in correspondence to a gate pattern;

forming an insulation film on the entire substrate including the upper portion of the seed pattern;

forming a photoresist on the insulation film, and then forming an etching mask that is self-aligned with the seed pattern by back exposure and has a recess pattern corresponding to the gate pattern;

forming a trench type contact window that exposes the seed pattern on the insulation film by an etching process using the etching mask; and forming a gate electrode on the seed pattern exposed by the trench type contact window by an electroplating method.

Preferably but not necessarily, the gate electrode formed on the seed pattern is formed of copper.

Preferably but not necessarily, the method of making a polysilicon thin film transistor further comprises the steps of: after having formed the gate electrode, sequentially forming the gate electrode and an amorphous silicon layer on the upper portions of the gate electrode and the trench type guide portion, respectively;

crystallizing the amorphous silicon layer to thereby form a polysilicon layer;

forming an ion implantation shielding mask on the upper portion of the polysilicon layer in alignment with the gate electrode; and ion-implanting the polysilicon layer using the ion implantation shielding mask, to thereby form a source region and a drain region.

Preferably but not necessarily, the step of forming the ion implantation shielding mask comprises the sub-steps of:

sequentially forming a protective oxide film and a photoresist on the upper portion of the polysilicon layer;

executing back exposure and developing by using the gate electrode as an exposure mask, to thereby form the etching mask that is made of the photoresist and is aligned with the gate electrode; and etching the protective oxide film using the etching mask, to thereby obtain the ion implantation shielding mask.

Preferably but not necessarily, the amorphous silicon layer is crystallized into the polysilicon layer by a metal induced lateral crystallization (MILC) method.

Preferably but not necessarily, the etching process if a reactive ion etching (RIE) process using hydrofluoride (HF).

ADVANTAGEOUS EFFECTS

Therefore, in the case of a polysilicon thin film transistor having a trench type bottom gate structure using copper and a method of making the same according to the present invention, copper with a low resistance value that is suitable for a large display is selectively formed into a thickness usable for a bottom gate according to an electroplating method, to thereby minimize a processing time and simultaneously omit a copper etching process.

In addition, the present invention can solve a step coverage problem without passing through a planarization process by selectively forming a trench type copper bottom gate structure using copper that is used as a gate electrode.

Furthermore, since the present invention uses copper for a gate electrode, a source region and a drain region can be automatically aligned with respect to a gate by back exposure without using a separate mask, to thereby minimize an alignment error.

DETAILED DESCRIPTION OF THE INVENTION

The above and/or other objects and/or advantages of the present invention will become more apparent by the following description.

Hereinbelow, a polysilicon thin film transistor having a trench type bottom gate structure using copper and a method of making the same according to a preferred embodiment of the present invention will be described in detail with reference to the accompanying drawings FIGS. 1 through 17.

Figure 17:
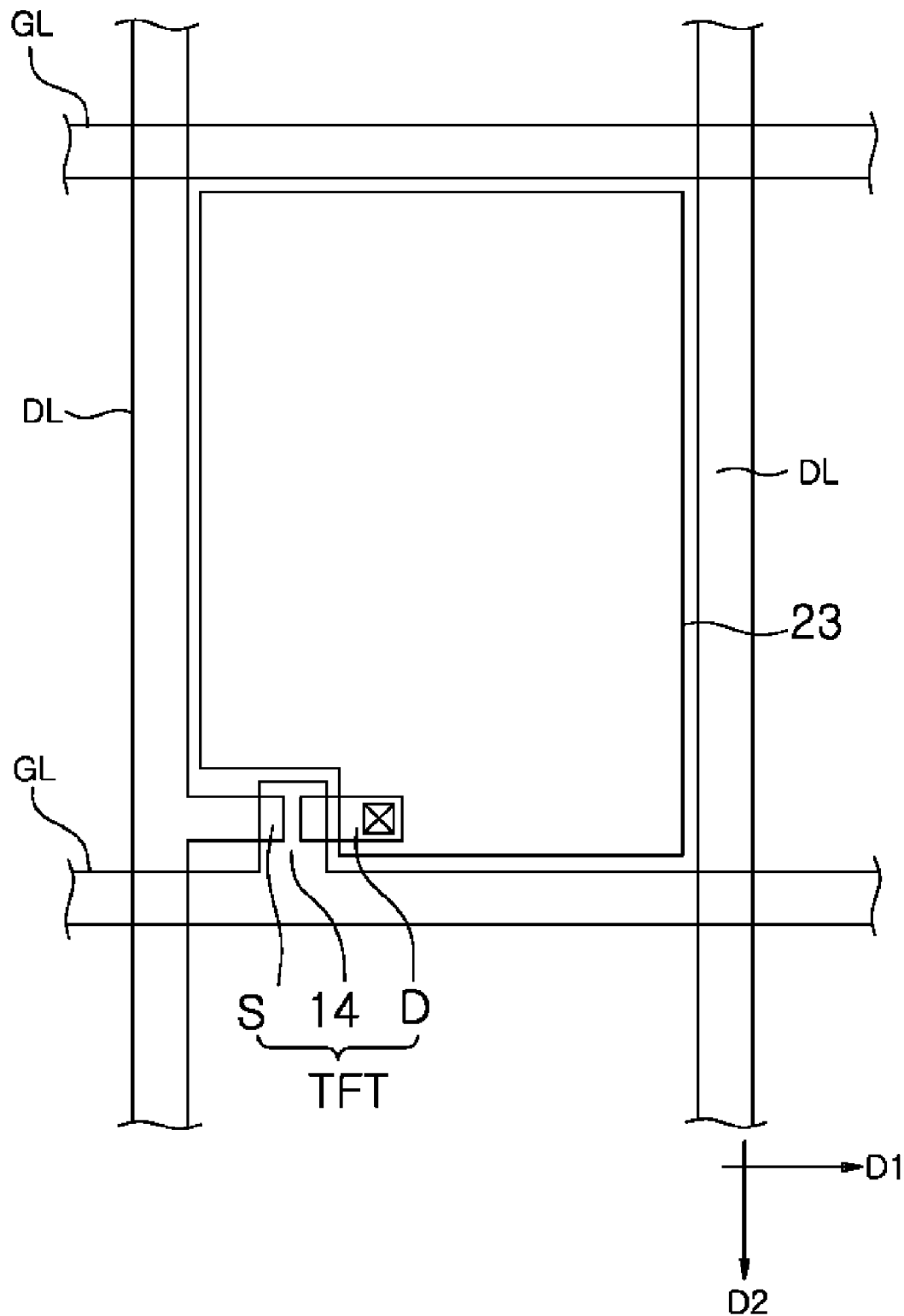
FIG. 17 is a plan view illustrating an array substrate of a liquid crystal display device according to the present invention.

FIG. 17 is a plan view illustrating an array substrate of a liquid crystal display device according to the present invention.

The liquid crystal display device includes an array substrate, a color filter substrate, and a liquid crystal layer formed between the array substrate and the color filter substrate, to thus display images thereon.

Referring to FIG. 17, the array substrate includes a number of gate lines (GLs) extended in a first direction (D1) and a number of data lines (DLs) extended in a second direction (D2) orthogonal to the first direction (D1). A number of pixel regions (pixel electrodes) 23 are defined by a number of the gate lines (GLs) that are formed simultaneously with a number of gate electrodes 14, or a number of the data lines (DLs) that are formed in a direction orthogonal to the number of the gate lines (GLs) and connected to a source electrode (S), respectively.

In addition, the array substrate includes a number of thin film transistors (TFTs) in which each thin film transistor (TFT) includes the gate electrode 14 branched from the gate line (GL), a source electrode (S) branched from the data line (DL), and a drain electrode (D) that is electrically connected in correspondence to the pixel electrode 23.

A process of manufacturing a thin film transistor (TFT) according to an embodiment of the present invention in which the thin film transistor (TFT) is included in the array substrate will be described with reference to FIGS. 1 through 16.

Figure 1:
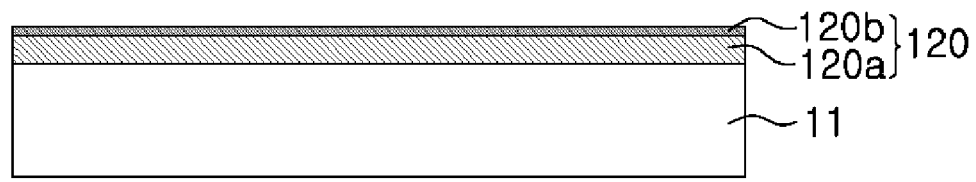
FIGS. 1 through 16 are cross-sectional views illustrating a trench type copper bottom gate thin film transistor according to an embodiment of the present invention.

As shown in FIG. 1, a base metal film 120 that is formed of a first adhesive layer 120a and a first electrode layer 120b that are respectively formed of a conductor, for example, one of Ni, MoW, and Al through a sputtering or thin film deposition method is formed on a transparent insulation substrate 11, for example, a glass substrate.

Here, the first adhesive layer 120a is formed into a thickness of 500 Å using nickel (Ni) for example, and the first electrode layer 120b is formed into a thickness of 2000 Å using molybdenum-tungsten (MoW) for example.

Figure 2:
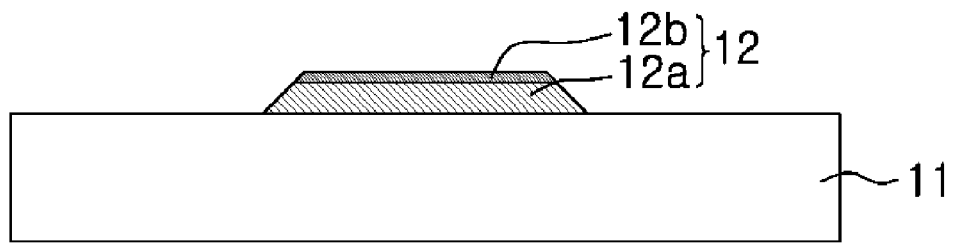

Then, after having formed a photoresist although it is not shown in FIG. 2, the base metal film 120 is patterned using a gate mask, to thereby form a seed pattern 12 in correspondence to the gate electrode of a shape shown in FIG. 2.

Figure 3:
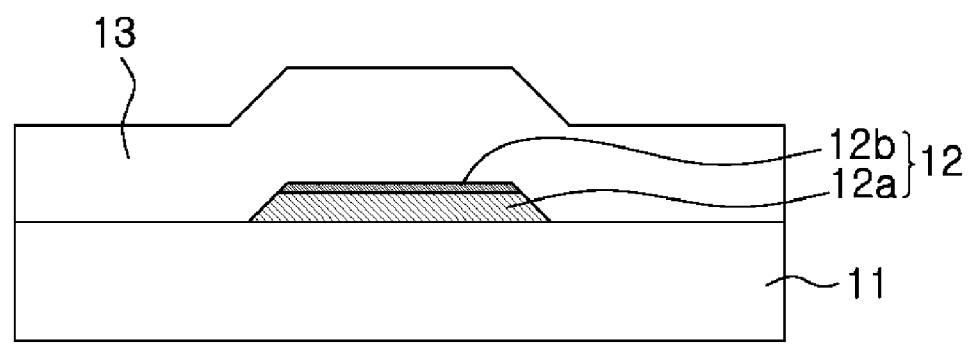

By doing so, the seed pattern 12 is completely formed. Upon completion of the seed pattern formation, for example, a 1.5 micrometer-thick insulating film 13 is deposited using silicon oxide or silicon nitride by a plasma enhanced chemical vapor deposition (PECVD) method as shown in FIG. 3.

Figure 4:
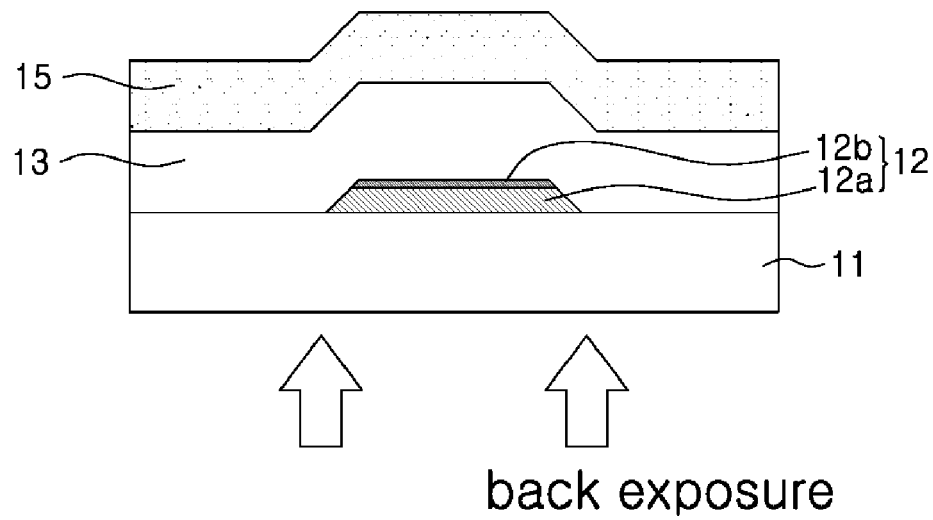
Figure 5:
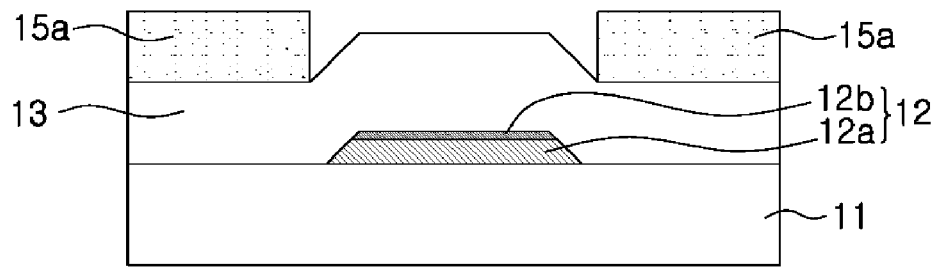
Figure 6:
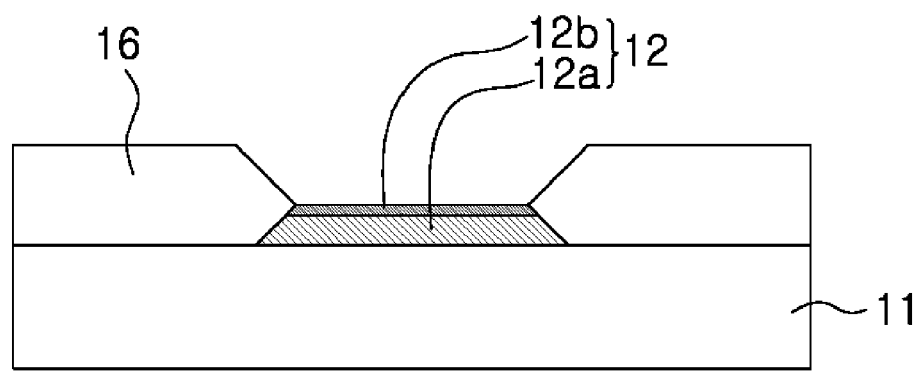

Thereafter, a photoresist layer 15 is coated on top of the insulating film 13, as shown in FIG. 4. Then, a back exposure process is performed. Then, the photoresist layer 15 is exposed and developed by the back exposure without using a mask and then the negative type photoresist layer 15 that is not exposed by the seed pattern 12 is removed. As a result, the remaining etching mask 15a is self-aligned, and a recess pattern is formed in correspondence to a gate pattern. Here, the insulation film 13 corresponding to the recess pattern corresponding to the gate pattern is reactive-ion-etched using hydrofluoride (HF) through the remaining etching mask 15a. Then, as shown in FIG. 6, a trench type guide portion 16 is formed on the insulation substrate 11 and thus a trench type contact window is formed to make the upper portion of the seed pattern 12 exposed. Thereafter, the etching mask 15a is removed.

Figure 7:
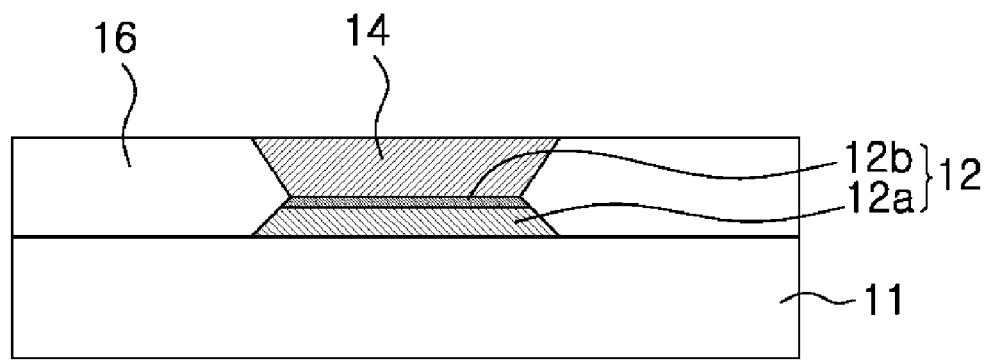

Subsequently, copper is selectively electrodeposited with one micrometer or more thick on the exposed seed pattern 12 by an electroplating method using the trench type guide portion 16. As a result, copper is not electrodeposited on the trench type guide portion 16 but is electrodeposited on only the exposed upper trench of the exposed seed pattern 12 to thus selectively form a gate electrode 14. In other words, the seed pattern 12 is set as a cathode and the copper is set as an anode, to then carry out an electroplating process. Accordingly, a copper gate electrode 14 is selectively formed as shown in FIG. 7. Therefore, since the upper surface of the trench type guide portion 16 is positioned on the same level as that of the copper gate electrode 14, a step coverage problem can be solved at the time of forming the gate insulation film without using a separate planarization process.

It takes ten minutes or less to form the copper of one micrometer or more by the electroplating process.

In this case, wires for gate lines (GLs) that are connected with the gate electrode 14 and are used to apply a gate signal to a thin film transistor (TFT) are preferably simultaneously formed. Here, data lines (DLs) that are connected to a source electrode (S) are also formed in the same process and material as those of the gate lines (GLs).

Figure 8:
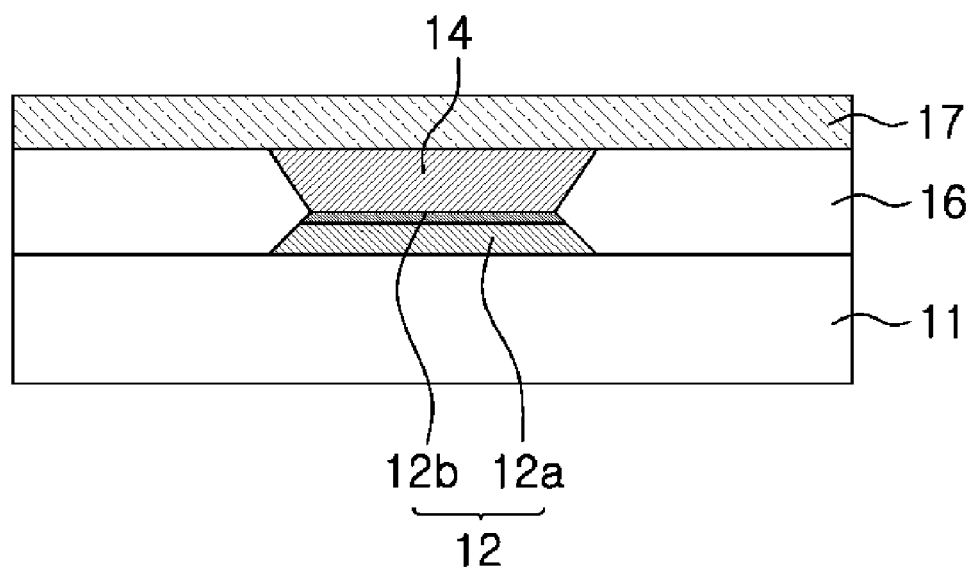
Figure 9:
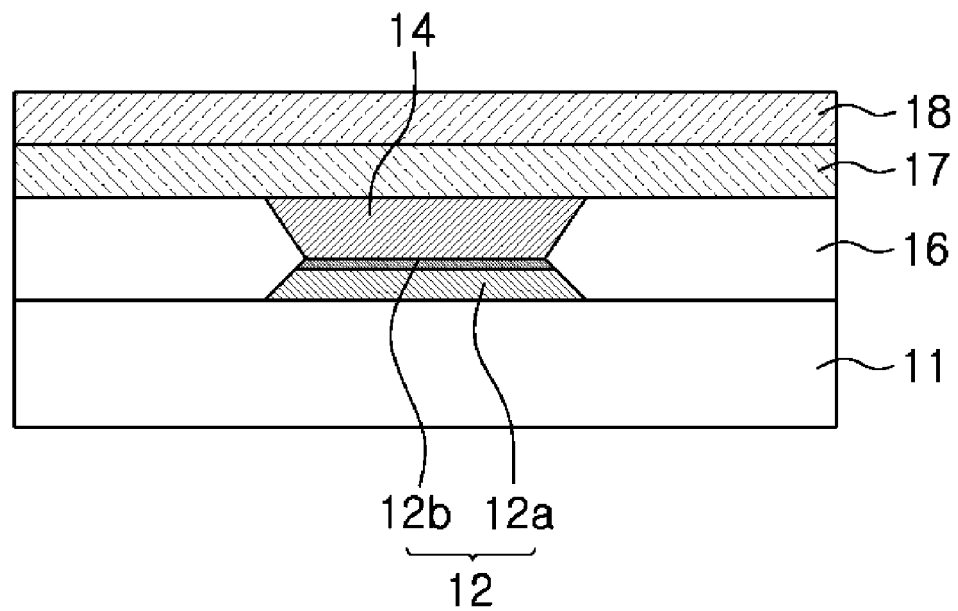

Then, as shown in FIG. 8, a gate insulation film 17 is deposited by a thickness of 1000 Å on the gate electrode 14 and the trench type guide portion 16, by a PECVD (Plasma-Enhanced Chemical Vapor Deposition) method, for example. A silicon oxide film or silicon nitride film can be used as the gate insulation film 17.

Then, an amorphous silicon layer 18 is deposited on the gate insulation film 17 by for example, a CVD (Chemical Vapor Deposition) method. In order to form a source region and a drain region during deposition of the amorphous silicon layer 18, an in-situ doping process can be simultaneously done.

In the case of forming the polysilicon thin film transistor (TFT), the in-situ doping process is not generally performed as will be described later. In the case that crystallization is performed using laser, a crystallization process is performed in front of or at the back of a protective oxide film. In the case of using a non-laser method, the crystallization process may vary depending on the applied method. In this embodiment, a metal induced lateral crystallization (MILC) method is applied for crystallization of the amorphous silicon layer as an example.

Figure 10:
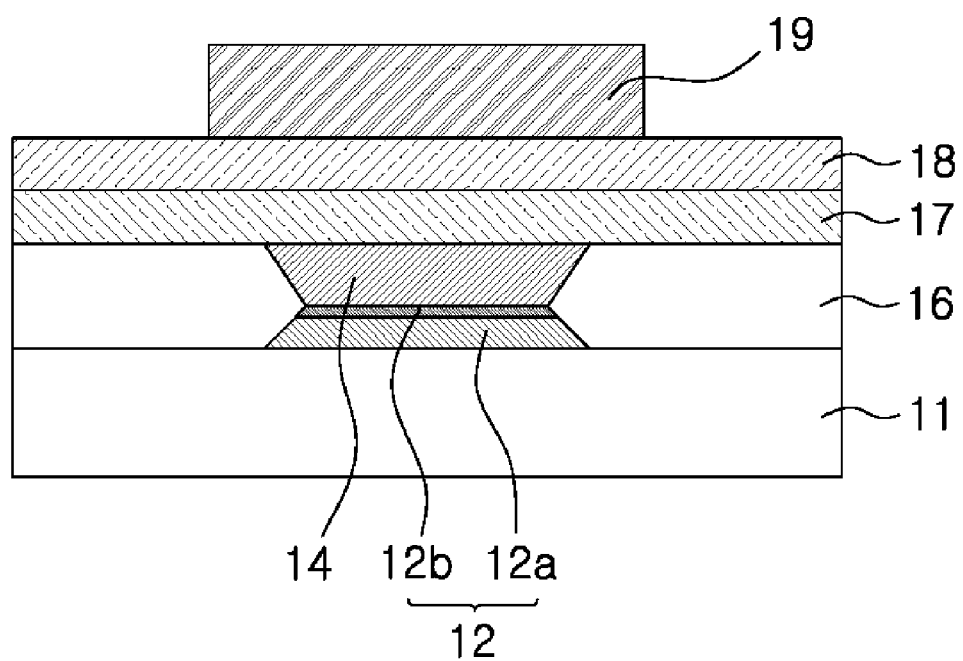
Figure 11:
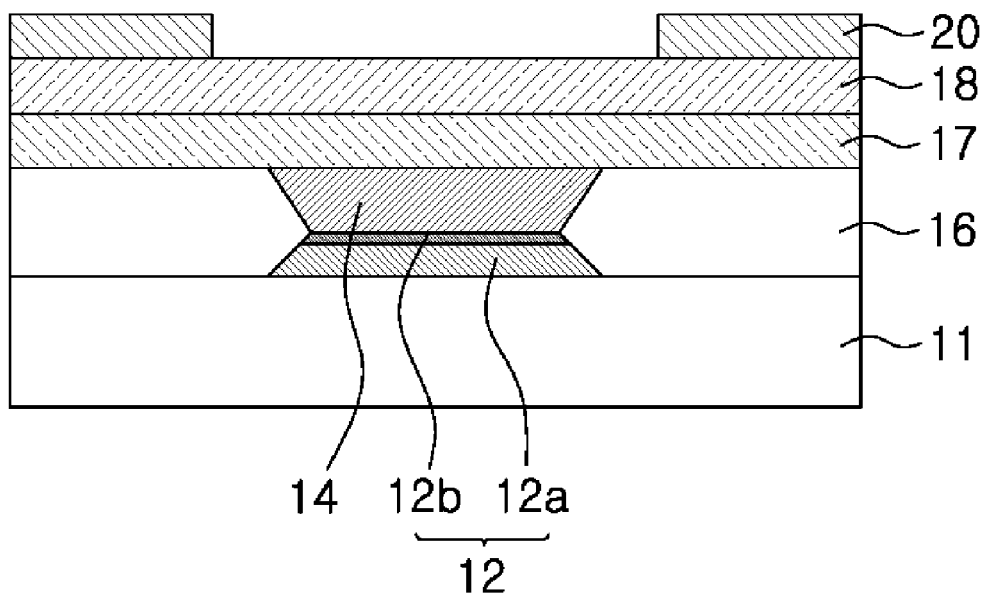

After the amorphous silicon layer 18 has been deposited, a photoresist mask 19 is formed as shown in FIG. 10, in order to form a metal induced film to induce crystallization of the amorphous silicon layer 18 by a lift-off method. Then, a nickel pattern layer 20 that is a metal induced film for the metal induced lateral crystallization (MILC) is formed on the photoresist mask 19 to then be removed as shown in FIG. 11. Here, Pd, Ti, Ag, Au, Al, Sn, Sb, Cu, Co, Cr, Mo, Tr, Ru, Rh, Cd, Pt, etc., may be used as materials of the crystallization metal induced film, in addition to nickel.

Figure 12:
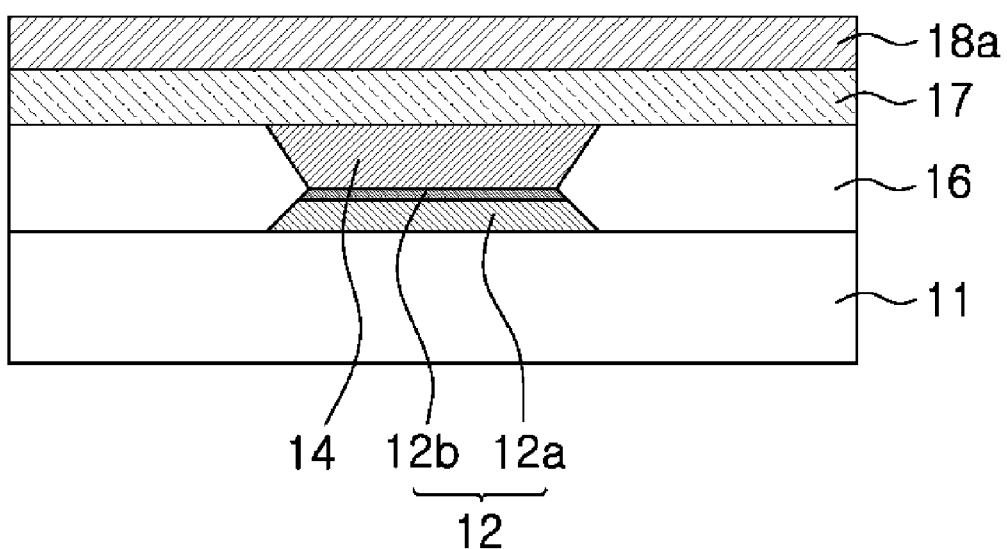

After the nickel pattern layer 20 has been formed, the amorphous silicon layer 18 is crystallized by a MILC (metal induced lateral crystallization) low-temperature heat treatment. Then, the nickel pattern layer 20 is removed to thereby form a crystallizing silicon layer 18a as shown in FIG. 12.

Here, a technology of metal-induced-lateral-crystallizing the amorphous silicon layer by the MILC heat treatment is disclosed in Korean Patent Laid-open Publication No. 10-2009-42122 that was filed earlier by the same inventor as that of the present invention. Accordingly, the detailed description thereof will be omitted.

Figure 13:
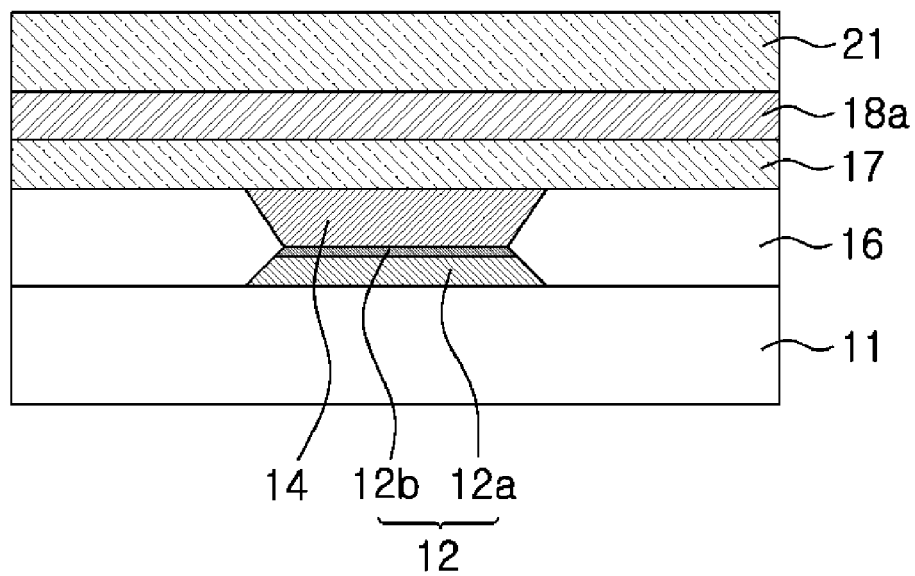

After the MILC heat treatment has been performed, the amorphous silicon layer has been completely crystallized, and then the polysilicon layer 18a has been formed, a protective oxide film 21 is deposited with a thickness of 3000 Å on the polysilicon layer 18a as shown in FIG. 13. In addition, a photoresist is coated on the protective oxide film 21 to thereby form a photoresist layer 22 as shown in FIG. 14.

Figure 14:
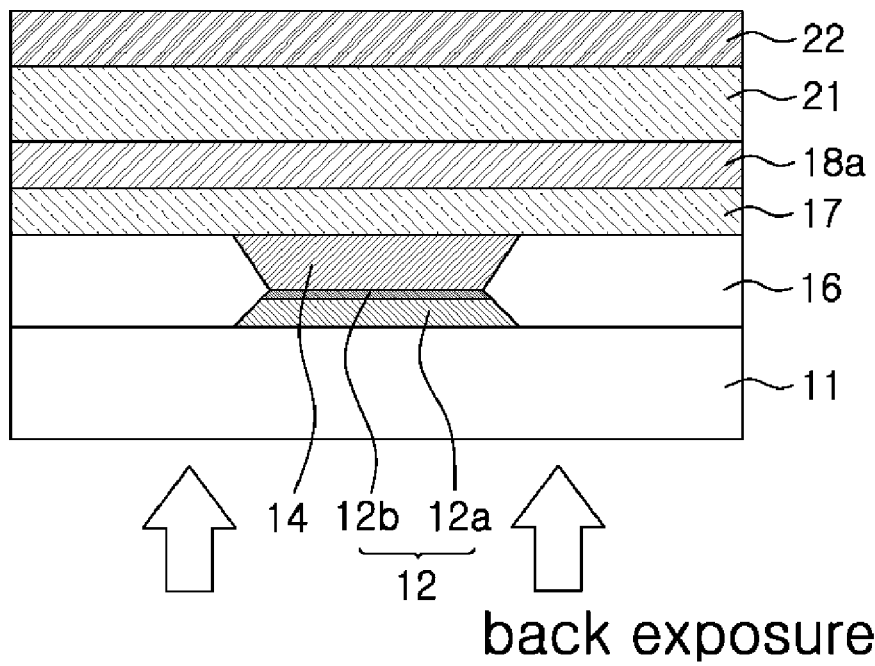
Figure 15:
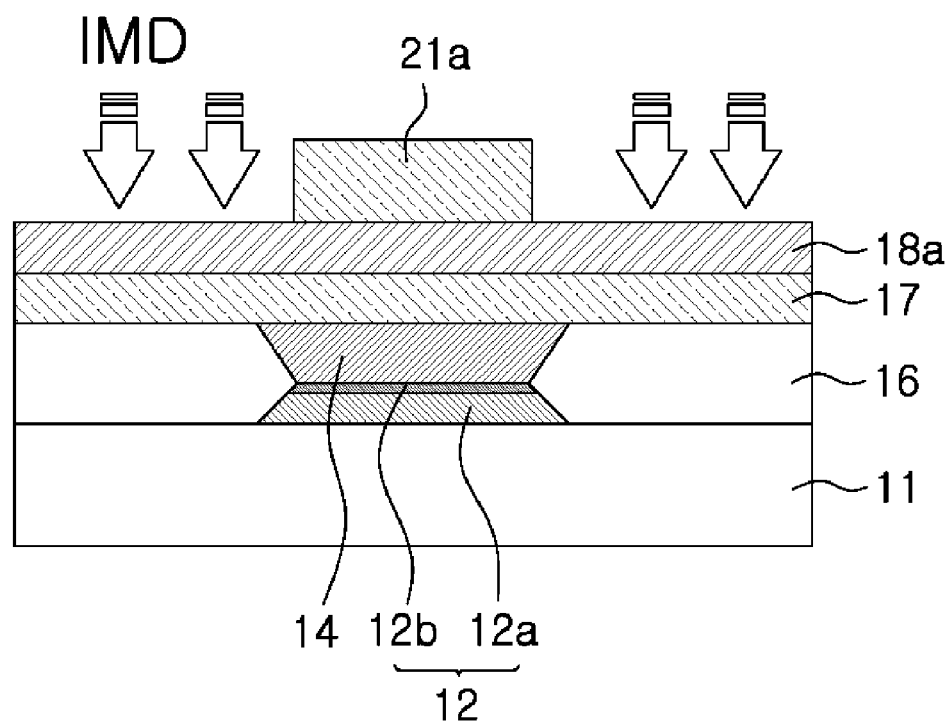

Then, as shown in FIG. 14, the photoresist layer 22 is exposed and developed by back exposure without using a mask. Then, the unexposed photoresist layer 22 is removed. Then, when the protective oxide film 21 is etched using a remaining etching mask (not shown), an ion implantation shielding mask 21a is formed as shown in FIG. 15.

Using the ion implantation shielding mask 21a, a source region and a drain region are formed by a dopant ion mass doping (IMD) process, and the ion mass doped dopant is activated by a heat treatment process.

Figure 16:
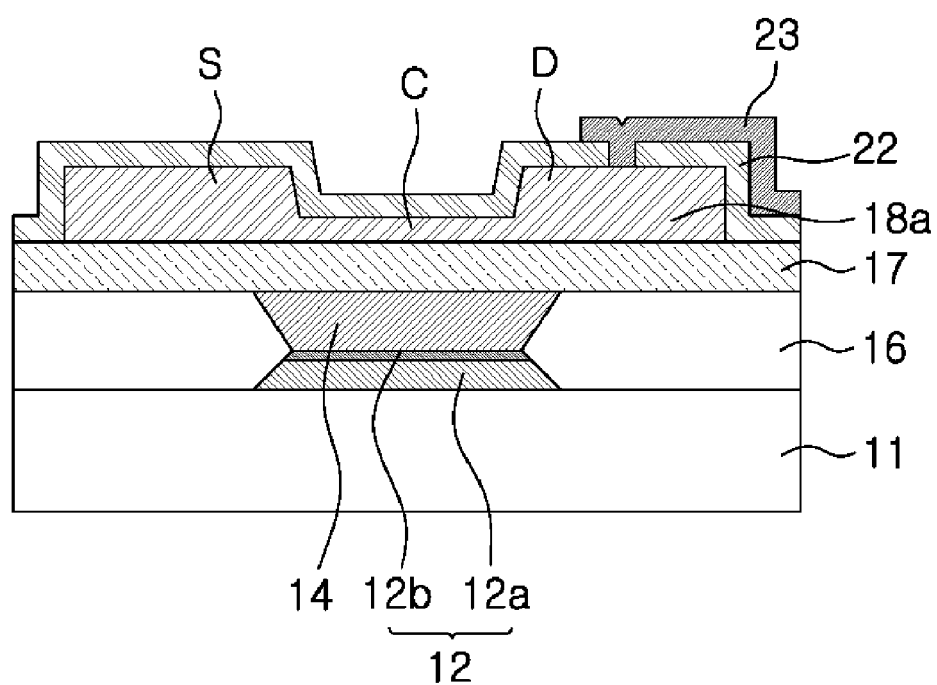

Referring to FIG. 16, etching masks (not shown) are formed on the activated source electrode (S) and the activated drain electrode (D), to then form a channel layer (C) by an etching process. Then, a protective film 22 made of an inorganic insulation film is formed on the channel layer (C) as well as the source electrode (S) and the drain electrode (D). Then, a contact hole that exposes the drain electrode (D) through the protective film 22 is formed. Then, a pixel electrode 23 made of ITO (indium tin oxide) or IZO (indium zinc oxide) is formed on the protective film 22, to accordingly complete manufacturing of an array substrate.

In the above description of the embodiment of the present invention, the case that the gate lines have been formed in the same manner and material as those of the gate electrode has been described as an example. However, the data lines that are connected to the source electrode can be formed in the same manner and material as those of the gate lines.

The above-described process of manufacturing the copper bottom gate thin film transistor may employ the other crystallization methods instead of the above-described MILC method, on the substrate where the planarized and thick gate copper wires are achieved. It is also possible to modify part of the TFT manufacturing process.

As described above, copper with a low resistance value that is suitable for a large display is formed into a thickness usable for a bottom gate according to an electroplating method, in the present invention, to thereby solve a step coverage problem without passing through a planarization process of copper that is used as a gate electrode.

In addition, since the present invention uses copper in a gate electrode, a source region and a drain region can be automatically aligned with respect to a gate by back exposure without using a separate mask, to thereby minimize an alignment error.

In the above embodiment of the present invention, the case that polysilicon has been used as an active area as an example, but it is possible to use amorphous silicon as the active area.

However, in this case, it is required to form a mask in the conventional well-known manner, instead of forming the ion implantation shielding mask using back exposure.

The present invention can be applied to a thin film transistor that is used for a display device such as an active-matrix liquid crystal display (AMLCD) or an active-matrix organic light emitting diode (AMOLED) display and a wiring method thereof.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

What is claimed is:

1. A polysilicon thin film transistor having a trench type copper bottom gate structure, the polysilicon thin film transistor comprising:
    a transparent insulation substrate;
    a seed pattern that is formed in a pattern corresponding to that of a gate electrode on the transparent insulation substrate, and that is used to form the gate electrode;
    a trench type guide portion having a trench type contact window in which an upper portion of the seed pattern is exposed;
    the gate electrode that is formed by electrodepositing copper on a trench of the exposed seed pattern;
    a gate insulation film formed on the upper portions of the gate electrode and the trench type guide portion, respectively; and
    a polysilicon layer in which a channel region, a source region and a drain region are formed on the upper portion of the gate insulation film.

2. The polysilicon thin film transistor having a trench type copper bottom gate structure, according to claim 1, wherein the source region and the drain region are automatically aligned with respect to the gate electrode by back exposure using the gate electrode and are disposed in the left and right sides of the channel region.

3. The polysilicon thin film transistor having a trench type copper bottom gate structure, according to claim 1, wherein the trench type guide portion is formed into a silicon oxide or nitride film.

4. The polysilicon thin film transistor having a trench type copper bottom gate structure, according to claim 1, wherein the gate electrode is connected with the gate lines made of copper.

5. The polysilicon thin film transistor having a trench type copper bottom gate structure, according to claim 1, wherein the gate electrode is at least one micrometer thick.

6. A method of making a polysilicon thin film transistor having a trench type copper bottom gate structure, the method comprising the steps of:
    forming a seed pattern on an upper portion of an insulation substrate in correspondence to a gate pattern;
    forming an insulation film on the entire substrate including the upper portion of the seed pattern;
    forming a photoresist on the insulation film, and then forming an etching mask that is self-aligned with the seed pattern by back exposure and has a recess pattern corresponding to the gate pattern;
    forming a trench type contact window that exposes the seed pattern on the insulation film by an etching process using the etching mask; and
    forming a gate electrode on the seed pattern exposed by the trench type contact window by an electroplating method.

7. The method of making a polysilicon thin film transistor having a trench type copper bottom gate structure of claim 6, wherein the gate electrode formed on the seed pattern is formed of copper.

8. The method of making a polysilicon thin film transistor having a trench type copper bottom gate structure of claim 6, further comprising the steps of: after having formed the gate electrode,
    sequentially forming the gate electrode and an amorphous silicon layer on the upper portions of the gate electrode and the trench type guide portion, respectively;
    crystallizing the amorphous silicon layer to thereby form a polysilicon layer;

forming an ion implantation shielding mask on the upper portion of the polysilicon layer in alignment with the gate electrode; and ion-implanting the polysilicon layer using the ion implantation shielding mask, to thereby form a source region and a drain region.

9. The method of making a polysilicon thin film transistor having a trench type copper bottom gate structure of claim 6, wherein the etching process if a reactive ion etching (RIE) process using hydrofluoride (HF).

10. The method of making a polysilicon thin film transistor having a trench type copper bottom gate structure of claim 8, wherein the step of forming the ion implantation shielding mask comprises the sub-steps of:

sequentially forming a protective oxide film and a photoresist on the upper portion of the polysilicon layer;

executing back exposure and developing by using the gate electrode as an exposure mask, to thereby form the etching mask that is made of the photoresist and is aligned with the gate electrode; and etching the protective oxide film using the etching mask, to thereby obtain the ion implantation shielding mask.

11. The method of making a polysilicon thin film transistor having a trench type copper bottom gate structure of claim 10, wherein the amorphous silicon layer is crystallized into the polysilicon layer by a metal induced lateral crystallization (MILC) method.

\* \* \* \* \*